(12) United States Patent
Mrozowicz

(10) Patent No.: US 9,727,670 B2
(45) Date of Patent: Aug. 8, 2017

(54) HORIZON NIGHT VIEW SIMULATION

(71) Applicant: The Boeing Company, Chicago, IL (US)

(72) Inventor: Slawomir Mrozowicz, Gdansk (PL)

(73) Assignee: The Boeing Company, Chicago, IL (US)

( * ) Notice: Subject to any disclaimer, the term of this patent is extended or adjusted under 35 U.S.C. 154(b) by 545 days.

(21) Appl. No.: 14/046,204

(22) Filed: Oct. 4, 2013

(65) Prior Publication Data

US 2015/0100291 A1    Apr. 9, 2015

(51) Int. Cl.

| | |
|---|---|
| *G06G 7/48* | (2006.01) |
| *G06F 17/50* | (2006.01) |
| *G01C 21/20* | (2006.01) |
| *G06T 15/00* | (2011.01) |
| *G08G 3/02* | (2006.01) |
| *G08G 9/02* | (2006.01) |

(52) U.S. Cl.
CPC ....... *G06F 17/5009* (2013.01); *G01C 21/203* (2013.01); *G06T 15/00* (2013.01); *G08G 3/02* (2013.01); *G08G 9/02* (2013.01); *B63B 2213/02* (2013.01)

(58) Field of Classification Search
CPC ........ G06F 17/5009; G08G 9/02; G08G 3/02; G01C 21/203; G06T 15/00; B63B 2213/02
USPC .......................................................... 703/6
See application file for complete search history.

(56) References Cited

U.S. PATENT DOCUMENTS

| | | | | |
|---|---|---|---|---|
| 3,694,558 | A * | 9/1972 | Eisenberg | G09B 9/063 359/212.1 |
| 6,196,845 | B1 * | 3/2001 | Streid | G09B 9/36 345/467 |
| 8,265,866 | B2 | 9/2012 | Altamura et al. | |
| 2002/0158872 | A1 * | 10/2002 | Randel | G06T 15/506 345/426 |
| 2012/0158287 | A1 | 6/2012 | Altamura et al. | |

OTHER PUBLICATIONS

International Search Report and Written Opinion from International Application No. PCT/US2014/051016 dated May 12, 2015.
Tatarchuk, Natalya, "Artist-directable rendering real-time rain rendering in city environments", Advanced Real-Time Rendering in 3D Graphics and Games, Dec. 31, 2006.
Eihachiro, Nakamae, et al., "A Lighting model aiming at drive simulators", ACM Siggraph Computer Graphics, vol. 24 No. 4, Sep. 1, 1990, pp. 395-404.

(Continued)

*Primary Examiner* — Dwin M Craig
(74) *Attorney, Agent, or Firm* — Miller, Matthias & Hull LLP

(57) ABSTRACT

Methods, systems, and computer-readable media are described herein for simulating a view of a horizon at night. The positions of a number of light sources may be determined from the perspective of a viewer location. A number of light attributes associated with the light sources are determined. A horizon view visualization is provided that includes a number of light representations corresponding with the light sources. The light representations are depicted according to the determined positions and light attributes.

20 Claims, 8 Drawing Sheets

(56) References Cited

OTHER PUBLICATIONS

"FS9-Zinertek HD Virtual Cockpit for the Level-D 767", Jun. 7, 2012, retrieved from the internet: URL:https//wwww.youtube.com/watc?v=iPkhhrRrw0s#t=66, retrieved Apr. 27, 2015.
SirFlight: "FSX Flight Simulator X HD—Extreme Graphics Night Landing ", Mar. 20, 2013, retrieved from internet: URL:https://ww.youtube.com/watch?v=No36pU6Zdc0; retrieved on Apr. 30, 2014.
"Ship Simulator Extremes Gameplay", Jun. 12, 2012, retrieved from internet URL:https://www.youtube.com/watch?v=f6-fxlx4rxc retrieved Apr. 27, 2015.
"Standards based SDK for high-fidelity, real-time visual" Dec. 31, 2009, retrieved from internet URL:http://www/rscsa.com/brochures/RSC Simhdr Datasheet 2012.pdf; retrieved Apr. 28, 2015.
Errol, Pierre-Louis, "Google Sky Map (for Android) Review and Rating" PCMag.com Jun. 8, 2009, retrieved from internet URL:http://ww.pcmag.com/article2/0,2817,2348372,00.asp, retrieved Apr. 28, 2015.
Wann, Jensen, H. et al., "A Physically-Based Night Sky Model" Computer Graphics, Siggraph 2001, Conference Proceedings, Los Angeles, CA, Aug. 12-17, 2001, New York, NY, Aug. 12, 2001, pp. 399-408.
Jensen, H., et al., "Night Rendering", Internet Citation, Apr. 15, 2010, retrieved from internet: URL:http://citeseerx.ist.psu.edu/viewdoc/downlaod?doi=10.1.1.35.7233&rep=rep1&type=pdf, retrieved Apr. 15, 2010, pp. 1-10.

\* cited by examiner

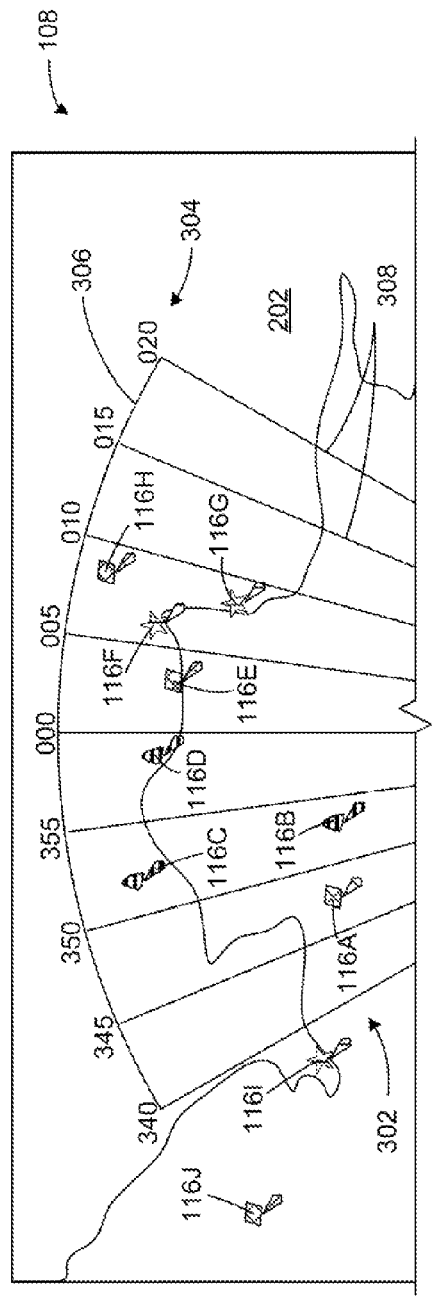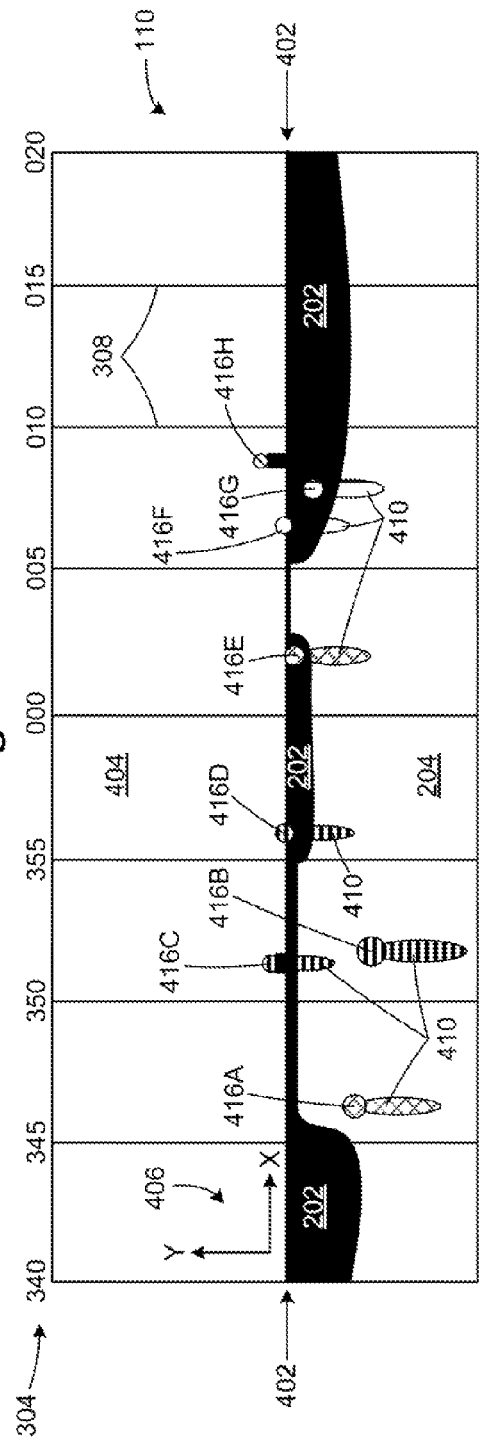
Fig. 4A
Fig. 4B

HORIZON NIGHT VIEW SIMULATION

BACKGROUND

Ships and other vehicles rely on various technologies for safe navigation. Ship crews may employ an electronic chart, such as an electronic chart display and information system (ECDIS), and global positioning system (GPS) to provide a dynamic, real-time visualization of the geographical features of the surrounding environment and the precise position of the ship within that environment. The crews may regularly cross-check the positioning of the ship as indicated on the ECDIS with the actual view from the bridge to ensure that the landmarks shown on the ECDIS correspond with what is actually seen from the ship.

This process is impeded at night since land and other objects plotted on the ECDIS are not easily seen. Accordingly, the ship crews are more reliant on GPS and the ECDIS for safe navigation during nighttime operations. While technology continues to improve in reliability, positioning errors may still be introduced due to equipment failures or calibration errors, among other reasons. To visually verify the position of a ship at nighttime, a crew member must manually locate landmarks or objects on the electronic chart that have a light or beacon, determine where that light should be with respect to the plotted ship position, look out from the ship in the direction in which the light is plotted on the chart with respect to the plotted ship position to visually confirm that a light exists, and repeat this process with one or more other lights from other objects to ensure that the lights seen from the ship are the correct lights associated with the objects on the electronic chart. This process is cumbersome, time consuming, and susceptible to human error.

It is with respect to these considerations and others that the disclosure made herein is presented.

SUMMARY

It should be appreciated that this Summary is provided to introduce a selection of concepts in a simplified form that are further described below in the Detailed Description. This Summary is not intended to be used to limit the scope of the claimed subject matter.

Methods, systems, and computer-readable media are described herein for providing simulating a night view of a horizon. According to one aspect described herein, a computer-implemented method includes determining a number of positions associated with a number of light sources from the perspective of a viewer location, as well as a number of attributes corresponding to the light sources. A horizon view visualization is provided that includes a number of light representations corresponding to the light sources, with the light representations shown according to the positions and attributes of the light sources.

According to another aspect, a computer-readable storage medium includes instructions that when executed by a computer, cause the computer to determine the positions of a number of light sources from a perspective of a viewer location. For each of the light sources, it is determined whether a reflection of the light source exists on water that is positioned between the user and the viewer location. A horizon view visualization is provided that includes light representations corresponding to the light sources, and a reflection representation for each light source having a reflection on the water.

According to yet another aspect, a computer-implemented method for simulating a night view of a horizon includes receiving a number of field of view parameters and determining a field of view according to those parameters. The positions of a number of light sources are determined from the perspective of a viewer location according to the field of view. Light attributes associated with the light sources are determined. For each light source, it is determined whether or not a reflection of the light source exists on water between the light source and the viewer location. For each reflection, a reflection characteristic is determined corresponding to the light source, the position of the light source with respect to the position of the viewer location, or the position of the light source with respect to the water. A horizon view visualization is provided according to the field of view. The horizon view visualization includes light representations corresponding to the light sources and depicting the light attributes, as well as a reflection representation with the determined reflection characteristic for each light source having a reflection on the water.

The features, functions, and advantages discussed herein can be achieved independently in various embodiments of the present disclosure or may be combined in yet other embodiments, further details of which can be seen with reference to the following description and drawings.

BRIEF DESCRIPTION OF THE DRAWINGS

FIG. 4A is a partial top view of the electronic chart of FIG. 3, according to various embodiments presented herein;

FIG. 4B is a horizon view visualization that includes the light sources within the field of view of FIG. 4A, according to various embodiments presented herein;

DETAILED DESCRIPTION

The following detailed description is directed to methods, computer-readable storage media, and other suitable technologies for providing a simulation of a horizon view at night. It should be appreciated that for clarity purposes, concepts disclosed herein will be described in the context of a ship navigating at nighttime. Although the concepts will be described in the context of a ship, the concepts and technologies described herein are applicable to any vehicle, land, sea, or air. Consequently, a "vehicle" as described herein and as recited in the accompanying claims, may include, but is not limited to, a ship, boat, submersible, aircraft, dirigible, land-based vehicle or craft, spacecraft, or any transportation apparatus.

As discussed briefly above, ship crews often utilize an electronic chart for navigational purposes. The electronic chart typically plots a representation of the ship's position according to GPS data, along with surrounding environmental features such as the location of nearby land, fixed objects such as buoys, and other landmarks. For position validation or for situational awareness purposes, a crew member may review an electronic chart to determine a ship's location, which coincides with the viewer's location, with respect to land, objects, and other environmental features plotted on the chart. After reviewing the chart, the crew member may look out at the horizon to identify the land, objects, and other environmental features seen on the chart. In this manner, the crew member may visually verify the position of the ship as coinciding with the position depicted on the chart.

However, this real-time visualization of the horizon from a perspective of the ship may have limited utility at night when the land, objects, and other features are not visible or not readily distinguishable due to the darkness. According to the concepts and technologies described herein, a night view simulation computer electronically plots representations of the lights in the correct positions with respect to an artificial horizon to create a horizon view visualization that is a simulation of the view that a crew member would see as he or she looks out at the horizon from a viewer position on the ship. The light representations may include similar characteristics as the actual lights, such as blink frequency, color, brightness, or a combination thereof. The horizon view visualization may also include light reflections of lights on or near the water, similar to the reflections that a crew member would see looking at the actual light on or near the water. Using this horizon view visualization, the crew member may see an electronic simulation of the view of the horizon at night on the ECDIS or other display, and then compare that simulation with the actual view to quickly validate positioning, to provide situational awareness, or to identify a particular light based on comparison of the horizon view visualization with the electronic chart.

Figure 1:
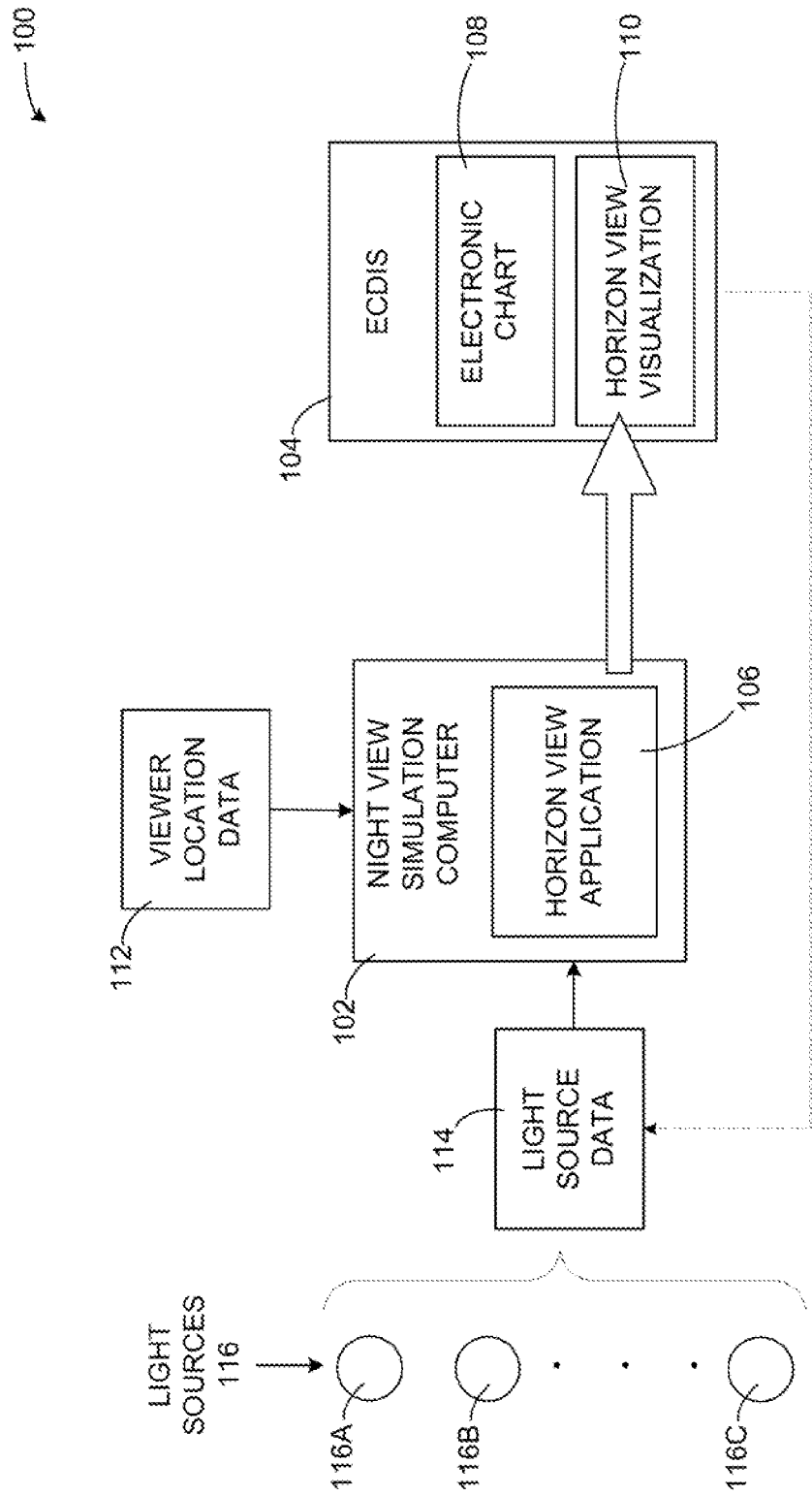
FIG. 1 is a block diagram of a horizon view simulation system according to various embodiments presented herein.

In the following detailed description, references are made to the accompanying drawings that form a part hereof and that show, by way of illustration, specific embodiments, or examples. In referring to the drawings, like numerals represent like elements throughout the several figures. FIG. 1 is a block diagram of a horizon view simulation system 100 according to embodiments described herein. FIG. 1 will be used to introduce the components of the horizon view simulation system 100. A detailed explanation and example embodiments will then be discussed with respect to FIGS. 2-7. For the purposes of this disclosure, the concepts and technologies described herein will be discussed in the context of use aboard a ship such that a crew member may utilize the horizon view simulation system 100 to compare a view of the actual horizon at night with a horizon view visualization 110 provided by the horizon view simulation system 100. However, it should be appreciated that the concepts disclosed herein are equally applicable to use on or with respect to any vehicle, structure, or platform.

According to various embodiments, the horizon view simulation system 100 includes a night view simulation computer 102 and an ECDIS 104. It should be appreciated that in some implementations, the night view simulation computer 102 may be incorporated into the ECDIS 104 or vice versa. For clarity, the night view simulation computer 102 and ECDIS will be described as separate components that may communicate directly or via a network (not shown here).

The night view simulation computer 102 may store and execute a horizon view application 106 that is operative to provide a horizon view visualization 110 per the embodiments disclosed herein. As will be described in greater detail below, the horizon view visualization 110 is a representation or simulation of the actual view of a horizon at night from the perspective of a viewer on the ship providing the visualization. Specific components of the night view simulation computer 102 will be described in greater detail below with respect to FIG. 8.

According to various embodiments, the night view simulation computer 102 receives light source data 114 corresponding to any number of light sources 116A-116N (generically referred to as light sources 116). A light source 116 may be any type of structure, object, ship, vehicle, aircraft, or other element that emits a light. Typical light sources 116 in the context of marine navigation include, but are not limited to, a light house, a buoy, a tower or other land-based structure, a ship or other vessel, or any navigational hazard. For the purposes of this disclosure, the light sources 116 may include any navigational lights that may be identified by a crew member of a ship for use during navigation.

The light source data 114 may include any type of information about the light sources 116, including, but not limited to, type, size, location, number, and bearing and speed when positioned on a moving object such as a ship, vehicle, or aircraft. Additionally, the light source data 114 may include light attributes associated with the light sources 116. Light attributes correspond to the visual characteristics associated with the light source 116. Examples of light attributes may include, but are not limited to, the brightness of the light, the color of the light, a frequency associated with a blinking light, a rotational velocity of a rotating beacon such as those associated with a lighthouse or airport, a blinking pattern or arrangement if not blinking according to a regular frequency, or any combination thereof. The light attributes or other light source data 114 may additionally include any display limitation associated with a light source 116. A display limitation may include any artificial or natural obstruction or other limitation in the projection of light from the light source 116. For example, a light source 116 may not be seen from a particular viewing angle or perspective due to an obstruction such as a building or terrain feature, or due to shielding purposefully provided to prevent light from shining on a particular geographic area. It should be appreciated that the light source data 114 may include any and all information that could be used to create a simulation of the light viewed from the position of the ECDIS 104.

The source of the light source data 114 may include transmission devices from the structures, vehicles, or objects associated with the light sources 116. For example some light sources 116 may transmit the light source data 114 via an automatic identification system (AIS). The light source data 114 may originate from a third party such as a command center, communications or data center, or other ship, vessel, or aircraft. The light source data 114 may additionally be measured and/or retrieved via applicable sensors and equipment on the ship, vehicle, or structure on which the ECDIS 104 is located. Additionally or alternatively, the light source data 114 may be provided by the ECDIS 104. Light sources 116 and corresponding light source data 114 are commonly provided on electronic navigational charts. Many ships utilize an ECDIS 104 that displays an electronic chart 108. The electronic chart may include the precise GPS location of the light sources 116 in a surrounding area, as well as corresponding information regarding the light source such as color, type, etc. The broken arrow in FIG. 1 indicates that according to various embodiments, the light source data 114 may originate from the ECDIS 104. It should be appreciated that this data may be stored in a local or remote data store and may be accessible by the ECDIS 104 or the night view simulation computer 102.

The night view simulation computer 102 additionally uses viewer location data 112 in order to prepare the horizon view visualization 110 from the perspective of the viewer. As previously stated, the viewer location may include the precise position of the viewer on the ship in which the horizon view visualization 110 is provided. In many implementations, the ECDIS 104 will provide the horizon view visualization 110 in conjunction with or proximate to the electronic chart 108. As the crew member reviews the horizon view visualization 110, he or she may look out at the horizon from that location to compare the horizon view visualization 110 with the actual view of the horizon. The viewer location data 112 may include GPS coordinates corresponding with the ship. Additionally, the viewer location data 112 may include the altitude or distance of the viewer location over the surface of the water. Any conventional means for receiving, retrieving, or determining the location of the viewer may be utilized to obtain and provide the viewer location data 112 to the night view simulation computer 102 for use by the horizon view application 106 in creating the horizon view visualization 110 described below.

Figure 2:
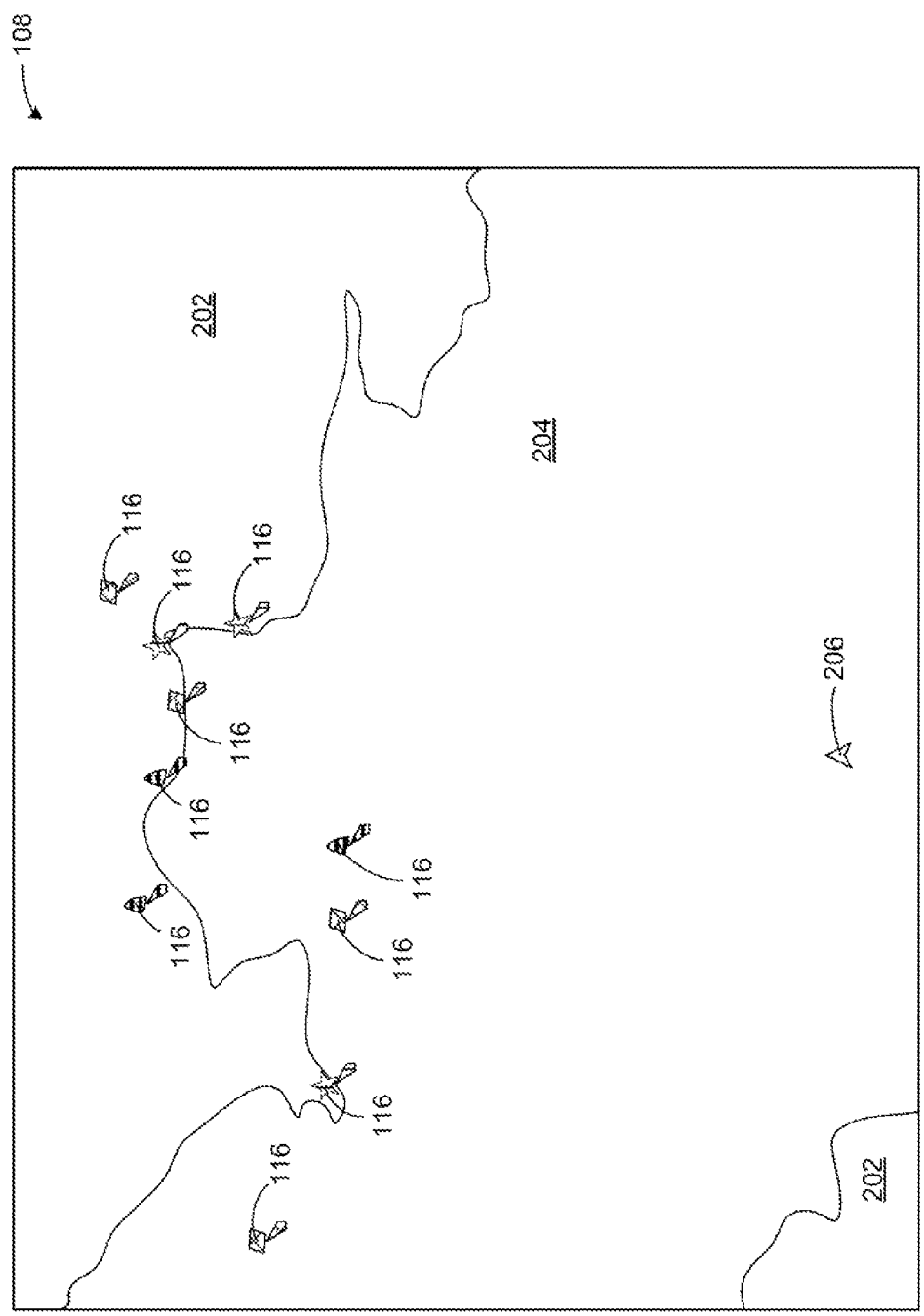
FIG. 2 is a top view of an electronic chart showing an illustrative representation of the position of a ship and the positions of light sources, according to various embodiments presented herein.

Turning now to FIG. 2, an example is provided of an electronic chart 108 showing various light sources 116 located within a vicinity of a ship, which is described herein as a viewer location 206. It should be appreciated that the viewer location 206 may include the geographic location from which a ship's crew member or other viewer may be looking out at the horizon, which corresponds to the view depicted by the horizon view visualization 110 described in detail below. As seen in FIG. 2, the electronic chart 108 may include representations of the land 202, water 204, and light sources 116 surrounding the viewer location 206. The objects, land, structures, and data provided by the electronic chart 108 has been simplified for clarity purposes.

According to this example, the ship associated with the viewer location 206 is navigating on the water 204, but is approaching or heading in the direction of the land 202. There are various types of light sources 116 shown, which are depicted with various shapes and fill patterns to represent various types of light source data 114 provided by the electronic chart 108. As discussed above, not all of the light source data 114 may be provided by or depicted on the electronic chart 108. Rather, the light source data 114 may originate from any number and applicable types of data sources without departing from the scope of this disclosure. As an example of the various types of light sources 116, the light sources 116 shown on the water 204 may be buoys or other ships. The light sources 116 positioned on the coast where the land 202 abuts the water 204 may include lighthouses, ports, or other structures. The light sources 116 inland from the coast may include towers, buildings, or airports. These examples are only for illustrative purposes and are not intended to be limiting.

Figure 3:
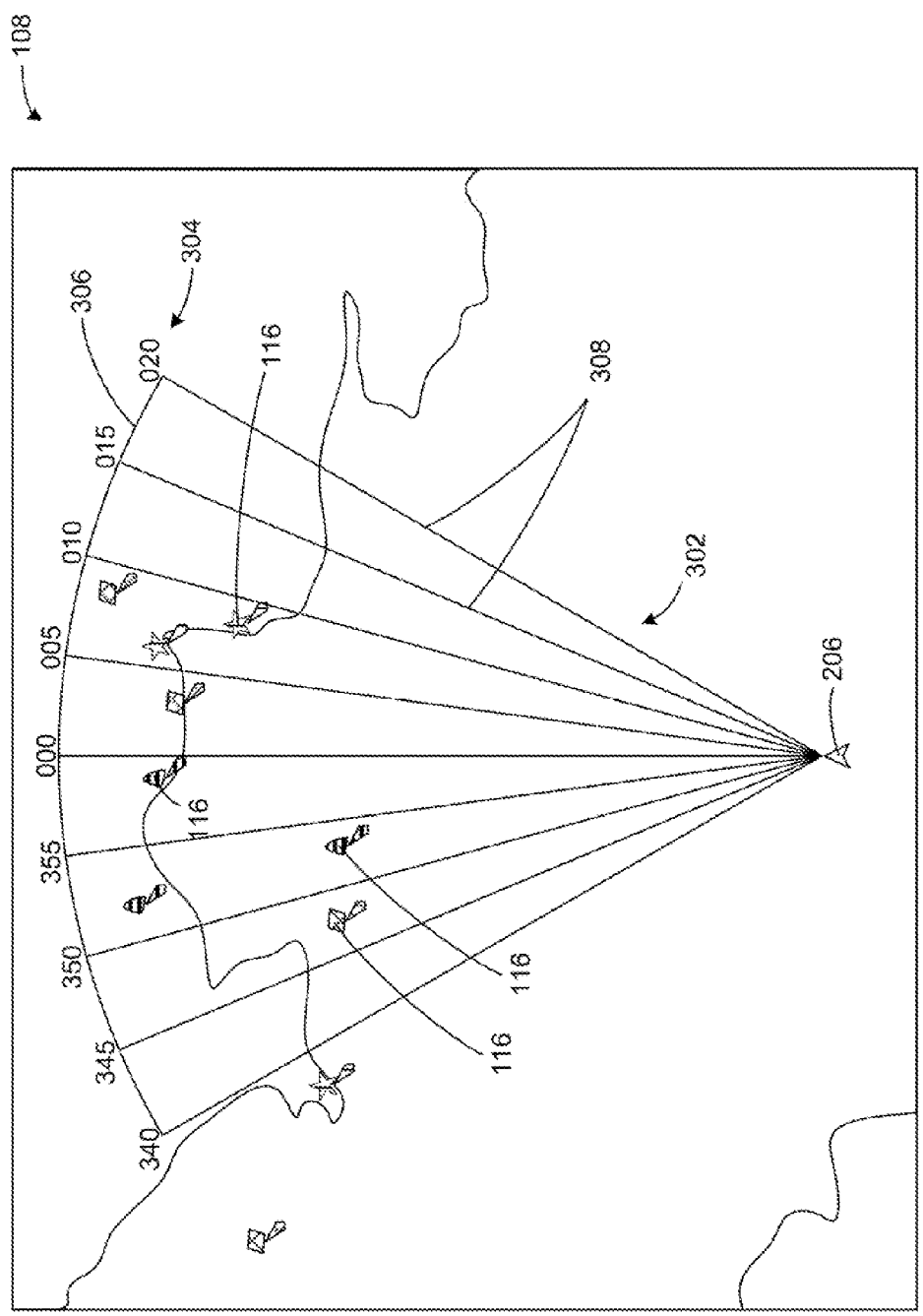
FIG. 3 is a top view of the electronic chart of FIG. 2, showing a field of view overlay, according to various embodiments presented herein.

FIG. 3 shows the electronic chart 108 of FIG. 2 with a field of view diagram 302 overlay, according to various embodiments presented herein. The field of view (FOV) diagram 302 defines the parameters by which the horizon view visualization 110 will be provided. According to this embodiment, the FOV diagram 302 includes bearing angles 304 positioned along the FOV width guide 306 at each intersection of a corresponding radial bearing indicator 308. The FOV diagram 302 originates at the viewer location 206 and spreads outwards in a direction indicated by the bearing angle 304 at the center of the FOV diagram 302, which according to this example, is 000 degrees, or North. The bearing angles 304 increase from 0 degrees to 360 degrees around a circle in which the viewer location 206 is positioned at the center. The bearing angles 304 correspond to a compass headings such that the bearing angle 304 of "090" corresponds to East, "180" corresponds to South, and "270" corresponds to West, with respective bearing angles and headings between. It should be appreciated that the FOV diagram 302 of FIG. 3 and others may not be drawn to scale.

According to the example shown in FIG. 3, the increments between the bearing angles 304 and corresponding radial bearing indicators 308 are five degrees. For example, from North located at 000 degrees, the next radial bearing indicator 308 moving clockwise from North is 005 degrees, followed by 010 degrees, and so on. As will be described in greater detail below with respect to FIGS. 6A-6C, these increments and other parameters corresponding to the FOV diagram 302 may be customized according to user preference.

According to various embodiments, when the FOV diagram 302 parameters are set, or during the FOV setup process, the FOV diagram 302 may be overlaid onto the electronic chart 108. When overlaid on the electronic chart 108, the FOV diagram 302 defines the area that will be shown in the horizon view visualization 110. In other words, all of the light sources 116 that are positioned between the FOV width guide 306 and the outermost radial bearing indicators 308 (corresponding to 340 degrees and 020 degrees in this example) will be accurately represented in the horizon view visualization 110.

Turning now to FIGS. 4A and 4B, an illustrative example of a horizon view visualization 110 will be shown and described. FIG. 4A shows the top portion of the electronic chart 108 of FIG. 3. In FIG. 4A, each of the light sources 116 have been assigned a unique reference number 116A-116J, which will be used in conjunction with FIG. 4B for comparison purposes. It should be noted that light sources 116I and 116J are not positioned within the FOV diagram 302, and therefore are not included within the horizon view visualization 110.

FIG. 4B shows the horizon view visualization 110 corresponding with the example of FIG. 4A. As discussed above, the horizon view visualization 110 represents a simulation of the view that a crew member or person at the viewer location 206 (as shown in FIG. 3) would see at night when looking at the horizon in a direction that includes 340 degrees to 020 degrees. Comparing FIGS. 4A and 4B, it can be seen that the horizon view application 106 has provided a light representation 416A-416H (generically referred to as light representations 416) corresponding to each of the light sources 116A-116H. For example, light source 116A in FIG. 4A, which is located at a bearing angle 304 that is between 345 degrees-350 degrees, is shown as light representation 416A on the horizon view visualization 110 of FIG. 4B. The remaining light sources 116B-116H are similarly shown as light representations 416B-416H on the horizon view visualization 110.

While the electronic chart 108 provides a top view of the geographical area surrounding the viewer location 206, the horizon view visualization 110 provides a front view of the same geographical area at night in the direction defined by the field of view 302. This night view simulated by the horizon view visualization 110 includes the horizon 402, with representations of the land 202, water 204, and night sky 404 with respect to the horizon 402. Each of the light representations 416 are positioned appropriately with respect to their height above or below the horizon 402, and at the correct bearing angle 304, as seen from the perspective of the viewer location 206. For the purposes of this discussion, the positions of the light representations 416 from left to right along the horizon 402 according to the corresponding bearing angle 304 may be referred to as the X-position according to the coordinate system 406. Similarly, the elevation of the light representations 416, or the position above or below the horizon 402 may be referred to as the Y-position according to the coordinate system 406. The determination of the Y-positions of the light representations 416 will be discussed in greater detail below with respect to FIG. 5.

According to various embodiments, the light representations 416 are depicted according to one or more light attributes associated with the light source 116. As discussed above, the light attributes include visual characteristics of the light, which may be included within the light source data 114 that is received or retrieved by the horizon view application 106. The light attributes may include characteristics such as color, brightness, frequency, rotational velocity, and blinking pattern. The light attributes have been depicted in FIG. 4B using patterns due to the limitations of black and white drawings. For example, the light representations 416B, 416C, and 416D are all depicted with a horizontal line pattern, which could represent a yellow light in an actual implementation. Similarly, light representations 416A, 416E, and 416H are depicted with a cross-hatched pattern, which could represent the color red in an actual implementation. The light representations 416G and 416F are depicted with a vertical line pattern, which could represent the color green.

The light representations 416 may additionally include any blinking, rotation, or other animation corresponding to other light attributes of any particular light source 116. According to one embodiment, a light attribute represented on the horizon view visualization 110 may include a realistic sizing of the light representation 416 according to a distance of each light representation from the viewer location 206. As seen in FIG. 4B, the light representation 416B is depicted with a circle that is larger than the light representation 416H. The light source 116B associated with light representation 416B is closer to the viewer location 206 than the light source 116H associated with the light representation 416H, as seen in FIG. 4A. Accordingly, to the viewer on the ship at the viewer location 206, the closer light source 116B would appear larger than the light source 116H, assuming the size, type, brightness, and other characteristics associated with the two lights are equivalent. In this embodiment, it should be appreciated that the light attribute corresponding to the size of the light representation 416 depicted on the horizon view visualization 110 is partially determined by the horizon view application 106 rather than wholly received or retrieved as light source data 114. In other words, the horizon view application 106 may utilize light source data 114 corresponding to light position, size, and brightness, and determine the size of the corresponding light representation 416 from the perspective of the viewer at the viewer location 206.

The land 202 is shown to be black in the horizon view visualization 110 of FIG. 4B, while the night sky 404 and the water 204 are shown to be white for clarity purposes. It should be appreciated that with a color monitor, not only could the light representations 416 be realistic as to color and other characteristics, the color, shading, or contrast of the night sky 404, land 202, and water 204 may be realistically portrayed according to the night view from the ship. Various shades of black or gray may be used to provide the contrast between these features. Alternatively or additionally, a light sensor or weather information may be used to determine ambient light levels so that the contrast between the night sky 404, land 202, and water 204 may be more accurately simulated.

According to various embodiments, the horizon view visualization 110 may include reflection representations 410 associated with some or all of the light representations 416. When looking at the horizon from the ship or other platform on the water 204, lights may have a reflection on the water's surface. The reflections extend from the light source 116 toward the viewer location 206, extending a length that is dependent upon various factors, including but not limited to the brightness of the light source 116, the horizontal visibility from the viewer location 206, and the state of the sea. When the light sources 116 are positioned near, but not on the water 204, the reflection representations 410 may be depicted with interruptions as opposed to being contiguous with the light representations 416. For example, reflection representations 410 corresponding to the light representations 416C-416G do not extend continuously from the light representations 416 toward the viewer. In doing so, the reflections associated with those light sources 116 are accurately represented, which visually provides the viewer with information that the corresponding light sources 116 are land-based, but proximate to the shoreline. In contrast, the viewer may easily see from the lack of a reflection representation 410, as well as the relative size of the light representation 416H, that the corresponding light source 116H is positioned inland, farther away from the other light sources 116A-116G.

In determining whether a reflection exists for a light source 116, the horizon view application 106 may determine whether the position of a light source 116 is within a threshold distance from water 204 positioned between the light source 116 and the viewer location 206, considering the amount of light emitted from the light source 116. Factoring in the elevation of the viewer location 206 and the light source 116 over the water 204, if the position of the light source 116 is within a threshold distance from the water 204 positioned between the light source 116 and the viewer location 206, then it may be determined that a reflection exists, and a corresponding reflection representation 410 may be created.

Figure 5:
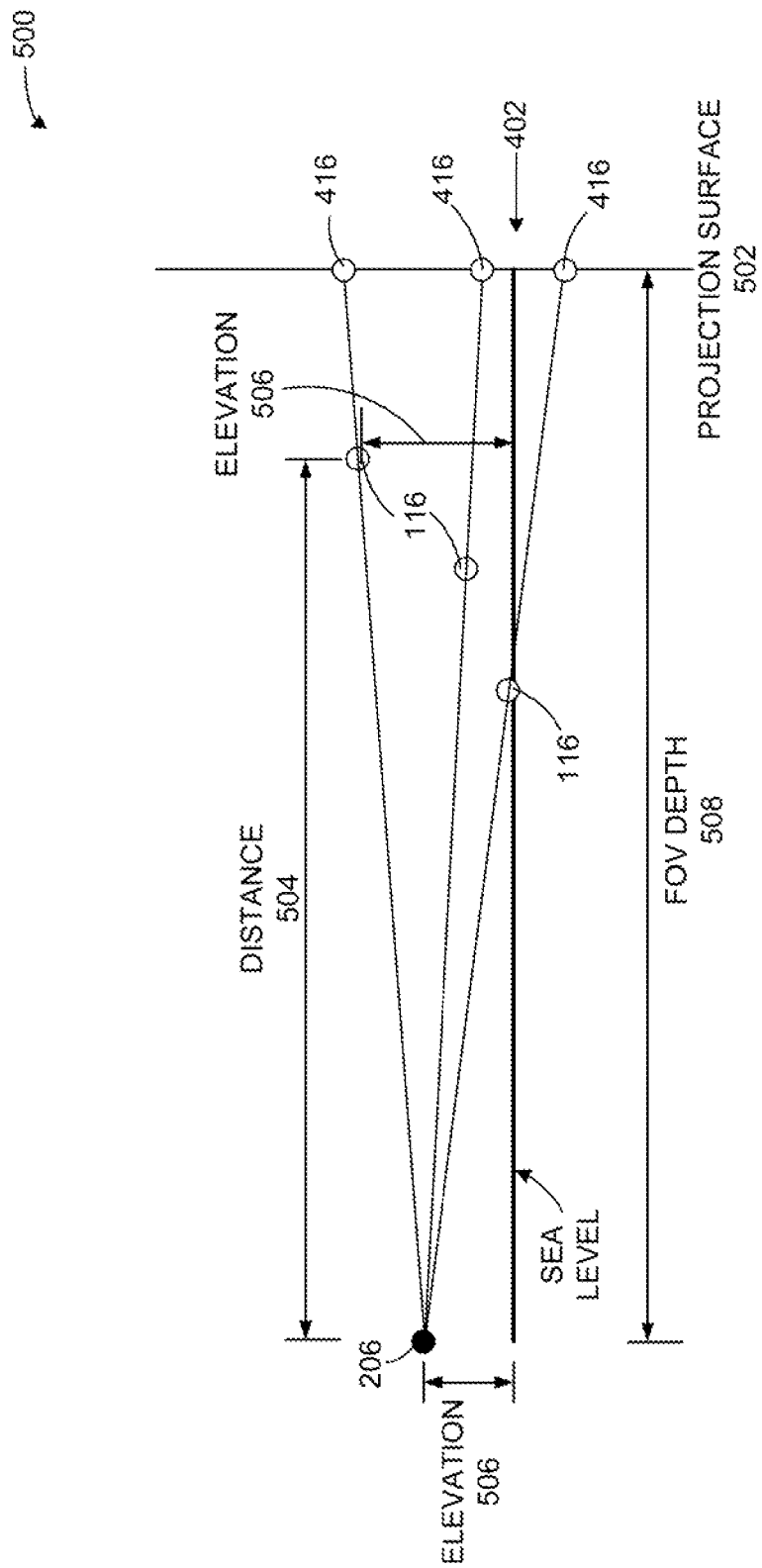
FIG. 5 is a side view of a light source projection diagram, showing light sources projections onto a vertical surface from the perspective of a viewer location, according to various embodiments presented herein.

Turning now to FIG. 5, a light source projection diagram 500 will be described. According to various embodiments, the light source projection diagram 500 illustrates the positioning determination associated with the vertical placement of the light representations 416 above or below the horizon 402 on the horizon view visualization 110. As discussed briefly above, this vertical position above or below the horizon 402 may be considered the Y-position of the light representations 416. The light source projection diagram 500 shows an example of a side view of a horizon view visualization 110. For clarity purposes, this example shows only three light sources 116, and consequently, does not directly correlate with the horizon view visualization 110 example of FIG. 4B.

As seen in the example of the light source projection diagram 500, the viewer location 206 is plotted a distance above sea level corresponding to the elevation 506 of the bridge or other position of the ECDIS 104 in which the viewer will be located when utilizing the horizon view visualization 110. Each light source 116 is positioned a corresponding distance 504 from the viewer location 206 according to the scale of the diagram. The light sources 116 are vertically positioned according to the corresponding elevation 506 over sea level. A projection surface 502 is positioned a distance from the viewer location 206 according to the selected FOV depth 508. The FOV depth 508 will be discussed in greater detail below with respect to FIG. 6C.

The projection surface 502 may be thought of as the two-dimensional screen on which the horizon view visualization 110 provides the simulation of the night view, including the light representations 416, reflection representations 410, and land 202. The intersection of the horizontal line representing sea level with the projection surface 502 corresponds to the horizon 402 of the horizon view visualization 110 shown in FIG. 4B. To determine the Y-position of each light representation 416, each light source 116 may be "projected" onto the projection surface 502 by extending a straight line from the viewer location 206, through the applicable light source 116, and to the projection surface 502. The point at which the line extending from the viewer location 206 through the light source 116 intersects the projection surface 502 is the Y-position of the light representation 416. Conventional geometry techniques may be used by the horizon view application 106 in determining the Y-positions of the light representations 416 given the elevations 506 of the viewer location 206 and of the light sources 116, the distances 504 of the light sources 116 from the viewer location 206, and the FOV depth 508. The elevation 506 of the viewer location 206 may be pre-programmed into the horizon view simulation system 100 according to the characteristics of the ship or platform containing the system. The distances 504 may be obtained utilizing the light source data 114 and viewer location data 112. The FOV depth 508 may be configured as described below.

Figure 6A:
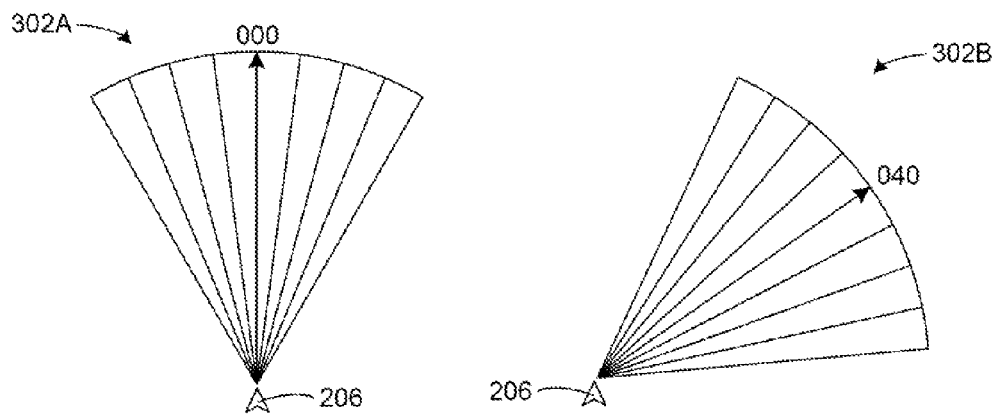
FIGS. 6A-6C are field of view diagrams illustrating various field of view parameters, according to various embodiments presented herein.
Figure 6B:
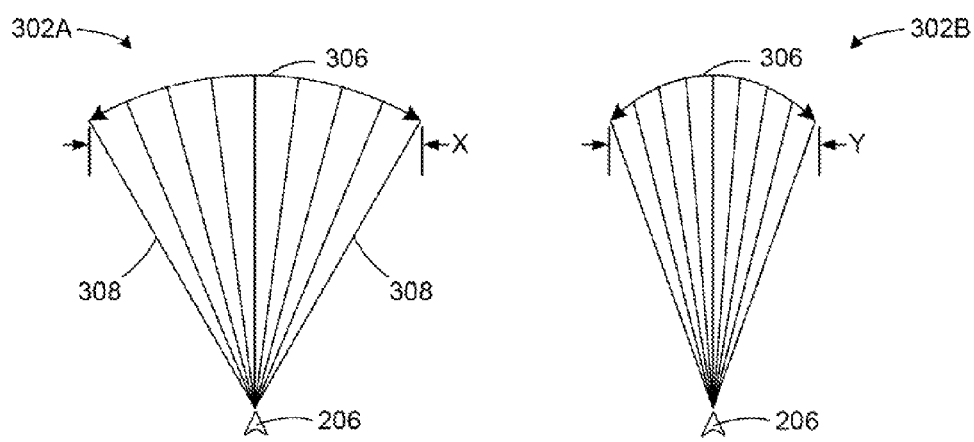
Figure 6C:
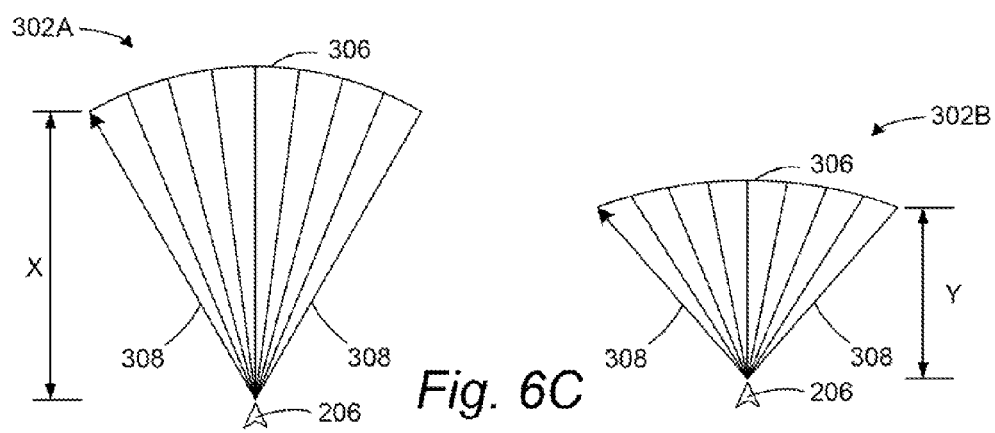

FIGS. 6A-6C show various field of view diagrams 302, illustrating field of view parameters that may be customized. According to various embodiments, a user may customize the parameters of the field of view that defines the details shown in the horizon view visualization 110. Specifically, a user may configure the horizon view visualization 110 to show a view of the horizon in a defined direction or bearing, for a defined width or range of bearing angles 304, and for a defined depth. FIG. 6A illustrates a change in direction or bearing of the FOV diagram 302. The first FOV diagram 302A shows a FOV direction that is centered on 000 degrees, or North. A resulting horizon view visualization 110 would include light representations 416 corresponding to all light sources 116 that are positioned within the first FOV diagram 302A when viewed in a direction of 000 degrees from the viewer location 206. To shift this view eastward, the user may rotate or otherwise move the first FOV diagram in a clockwise direction to arrive at the second FOV diagram 302B, which is facing a bearing of 040 degrees. The resulting horizon view visualization 110 would include light representations 416 corresponding to all light sources 116 that are positioned within the second FOV diagram 302B when viewed in a direction of 040 degrees from the viewer location 206.

To alter a parameter of a FOV diagram 302, a user may click or otherwise select an appropriate diagram control and drag or modify the FOV diagram 302 accordingly. For example, in the embodiment shown in FIG. 6A, the user may select the central radial bearing indicator 308A to initiate a modification to the view direction associated with the first FOV diagram 302A. In doing so, the central radial bearing indicator 308A provides an arrow to indicate a permitted parameter change, and specifically a modification to the view direction. The user may then drag, slide, rotate, or otherwise move the first FOV diagram 302A to arrive at the second FOV diagram 302B at the modified view direction of 040 degrees. It should be appreciated that the parameter modifications described herein may be made using any conventional mechanism without departing from the scope of this disclosure.

FIG. 6B illustrates a change in the FOV width or range of bearing angles 304 of the FOV diagram 302. The first FOV diagram 302A has a FOV width guide 306 of width X. A resulting horizon view visualization 110 would include light representations 416 corresponding to all light sources 116 that are positioned within the first FOV diagram 302A bound by the outermost radial bearing indicators 308 and the FOV width guide 306. To narrow or widen the width of the FOV diagram 302A, the user may select the FOV width guide 306 and drag the FOV width guide 306 outwards or inwards to widen or narrow the width, respectively. In this example, the user has narrowed the width of the first FOV diagram 302A to arrive at the second FOV diagram 302B having a FOV width guide 306 of width Y that is less than width X. The resulting horizon view visualization 110 would include light representations 416 corresponding to all light sources 116 that are positioned within the second FOV diagram 302B. It should also be appreciated that the number or increments of the radial bearing indicators 308 may be also configured by the user as desired.

FIG. 6C illustrates a change in the depth of the FOV diagram 302. The FOV depth may be considered the distance from the viewer location 206. For example, a user may configure the horizon view visualization 110 to display a simulation of a view of the horizon extending X miles (or any desired unit of measure) from the viewer location 206. According to this example the first FOV diagram 302A has a depth of distance X. A resulting horizon view visualization 110 would include light representations 416 corresponding to all light sources 116 that are positioned within the first FOV diagram 302A bound by the outermost radial bearing indicators 308 and the FOV width guide 306, which is set at a depth of X miles from the viewer location 206. To shorten or lengthen the depth of the FOV diagram 302A, the user may select an appropriate radial bearing indicator 308 or other control, and drag the FOV diagram 302A downwards or upwards to shorten or lengthen the depth, respectively. In this example, the user has shortened the depth X of the first FOV diagram 302A to arrive at the second FOV diagram 302B having depth Y that is less than depth X. The resulting horizon view visualization 110 would include light representations 416 corresponding to all light sources 116 that are positioned within the second FOV diagram 302B.

Figure 7:
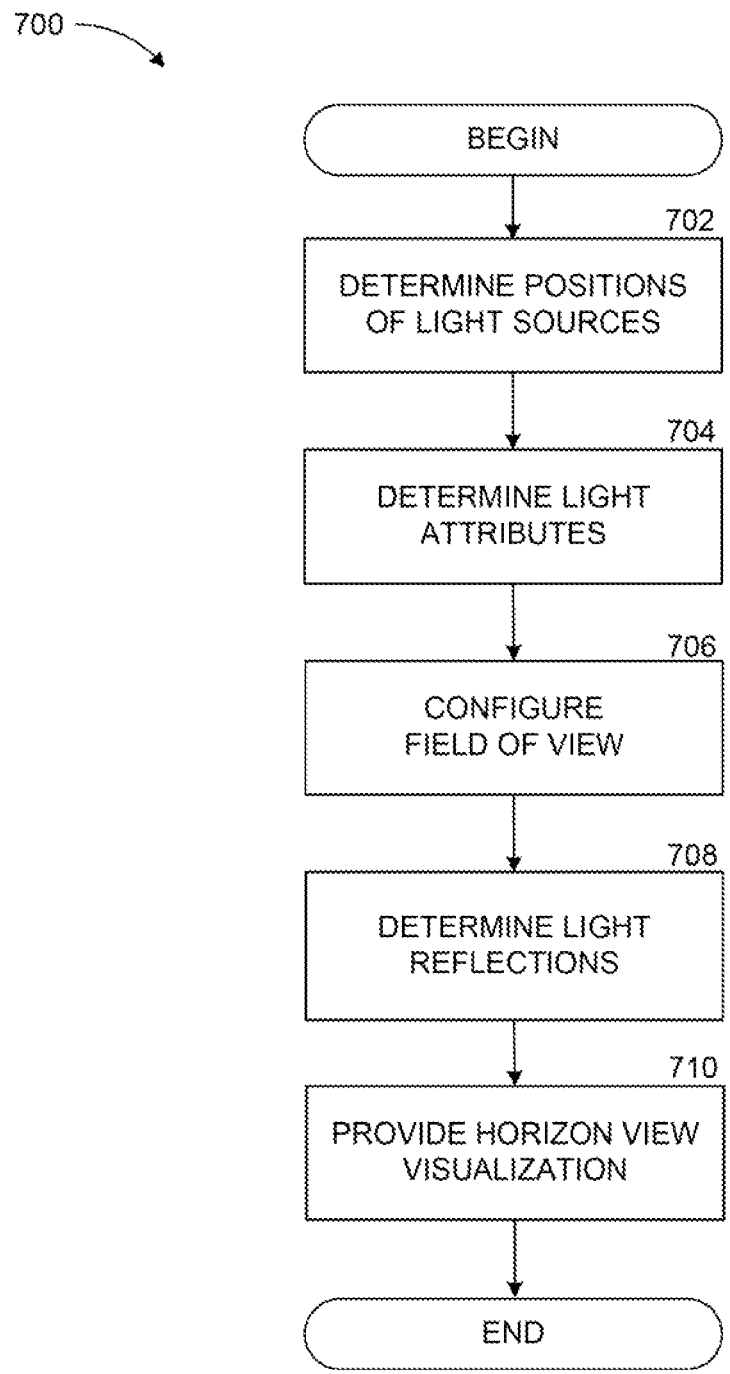
FIG. 7 is a flow diagram illustrating a method for simulating a night view of a horizon, according to various embodiments presented herein.

Referring now to FIG. 7, additional details will be provided regarding embodiments presented herein for providing an automated validation of vehicle positioning. It should be appreciated that the logical operations described herein are implemented (1) as a sequence of computer implemented acts or program modules running on a computing system and/or (2) as interconnected machine logic circuits or circuit modules within the computing system. The implementation is a matter of choice dependent on the performance and other operating parameters of the computing system. Accordingly, the logical operations described herein are referred to variously as operations, structural devices, acts, or modules. These operations, structural devices, acts, and modules may be implemented in software, in firmware, hardware, in special purpose digital logic, and any combination thereof.

It should also be appreciated that more or fewer operations may be performed than shown in the figures and described herein. These operations may also be performed in parallel, or in a different order than those described herein.

FIG. 7 shows a routine 700 for providing a simulation of a night view of a horizon. In some embodiments, the routine 700 may be performed by the horizon view application 106, including or in combination with the ECDIS 104. The routine 700 begins at operation 702, where the positions of each of the light sources 116 are determined. As discussed above, this determination may be made by the horizon view application 106 using light source data 114. At operation 704, the light attributes associated with the light sources 116 are determined. The light attributes may include any characteristic of the light source 116 or corresponding light emitted from the light source 116, including any display limitations. These light attributes may be determined from the light source data 114 received from the light sources 116, stored elsewhere, or measured.

From operation 704, the routine 700 continues to operation 706, where the FOV diagram 302 is configured. As illustrated and described with respect to FIGS. 6A-6C, any number of parameters associated with the FOV diagram 302, including but not limited to the direction, the width, and the depth of the FOV diagram 302, may be customized according to user preference. The routine 700 continues from operation 706 to operation 708, where the horizon view application 106 determines whether any of the light sources 116 emit light that reflects on the surface of the water 204. This determination may include determining whether a reflection exists based on the elevations 506 of the light source 116 and viewer location 206, coupled with the proximity of the light source 116 with the water 504. At operation 710, the horizon view application 106 provides the horizon view visualization 110 according to the configured FOV diagram 302, positions of the light sources 116, light attributes, and light reflections. The light representations 416 and corresponding reflection representations 410 are positioned at their X-positions and Y-positions with respect to the horizon 402, any land 202, and the radial bearing indicators 308, and the routine 700 ends.

Figure 8:
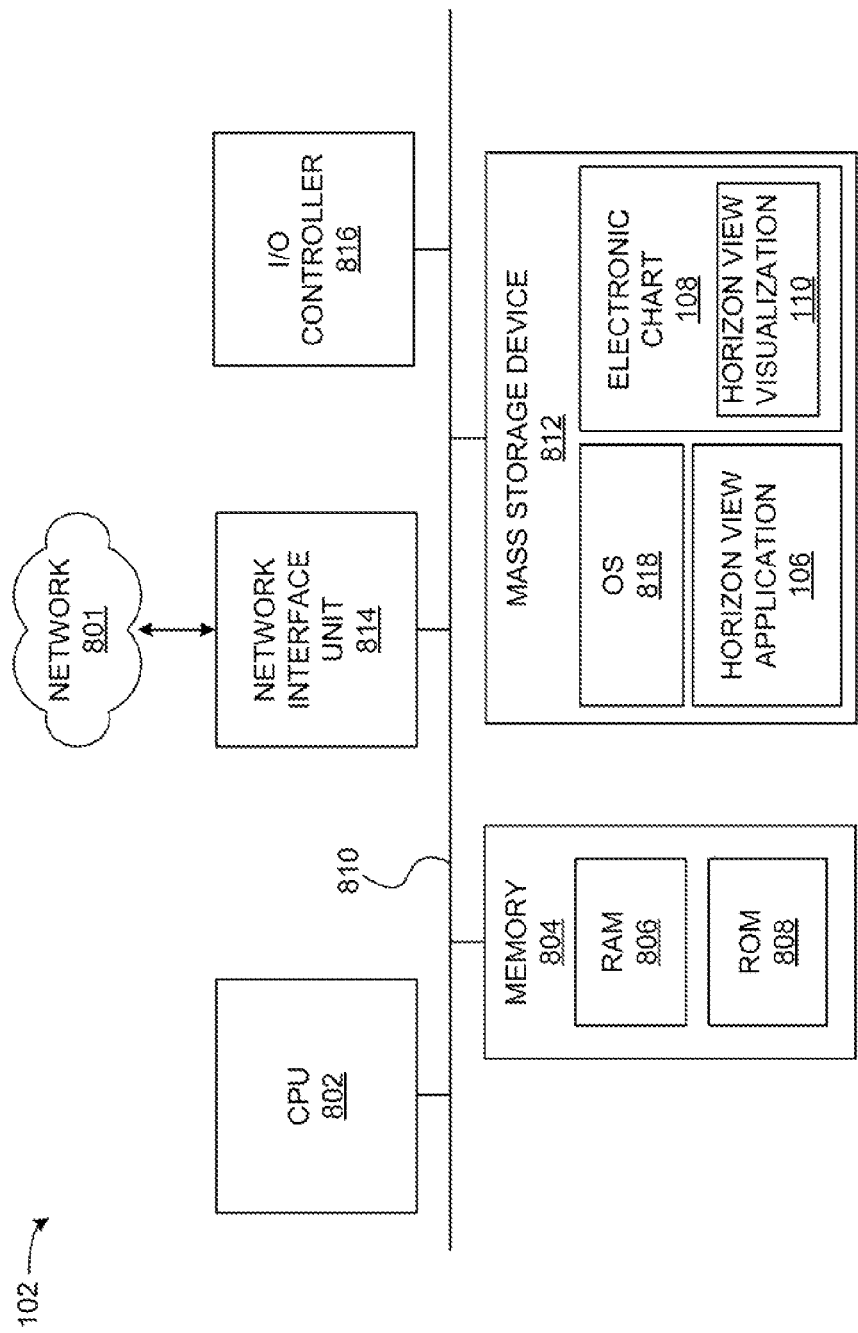
FIG. 8 is a block diagram showing an illustrative computer hardware and software architecture for a computing system capable of implementing aspects of the embodiments presented herein.

FIG. 8 shows an illustrative night view simulation computer 102 capable of executing the software elements described herein for providing validation of a vehicle position. The night view simulation computer 102 may be embodied in single computing device or in a combination of one or more processing units, storage units, and/or other computing devices. As described above, the night view simulation computer 102 may include the ECDIS 104, or may operate in combination with the ECDIS 104. The night view simulation computer 102 includes one or more central processing units 802 (CPUs), a system memory 804, including a random access memory 806 (RAM) and a read-only memory 808 (ROM), and a system bus 810 that couples the memory to the CPUs 802.

The CPUs 802 may be standard programmable processors that perform arithmetic and logical operations necessary for the operation of the night view simulation computer 102. The CPUs 802 may perform the necessary operations by transitioning from one discrete, physical state to the next through the manipulation of switching elements that differentiate between and change these states. Switching elements may generally include electronic circuits that maintain one of two binary states, such as flip-flops, and electronic circuits that provide an output state based on the logical combination of the states of one or more other switching elements, such as logic gates. These basic switching elements may be combined to create more complex logic circuits, including registers, adders-subtractors, arithmetic logic units, floating-point units, and the like.

The night view simulation computer 102 also includes a mass storage device 812. The mass storage device 812 may be connected to the CPUs 802 through a mass storage controller (not shown) further connected to the bus 810. The mass storage device 812 and its associated computer-readable media provide non-volatile, non-transitory storage for the night view simulation computer 102. The mass storage device 812 may store an operating system 818, as well as specific application modules or other program modules, such as the horizon view application 106, described above. The mass storage device 812 may also store data collected or utilized by the various systems and modules, such as the electronic chart 108 and horizon view visualization 110 described above.

The night view simulation computer 102 may store programs and data on the mass storage device 812 by transforming the physical state of the mass storage device to reflect the information being stored. The specific transformation of physical state may depend on various factors, in different implementations of this disclosure. Examples of such factors may include, but are not limited to, the technology used to implement the mass storage device 812, whether the mass storage device is characterized as primary or secondary storage, and the like. For example, the night view simulation computer 102 may store information to the mass storage device 812 by issuing instructions through the storage controller to alter the magnetic characteristics of a particular location within a magnetic disk drive device, the reflective or refractive characteristics of a particular location in an optical storage device, or the electrical characteristics of a particular capacitor, transistor, or other discrete element in a solid-state storage device. Other transformations of physical media are possible without departing from the scope and spirit of the present description, with the foregoing examples provided only to facilitate this description. The night view simulation computer 102 may further read information from the mass storage device 812 by detecting the physical states or characteristics of one or more particular locations within the mass storage device.

Although the description of computer-readable media contained herein refers to a mass storage device, such as a hard disk or CD-ROM drive, it should be appreciated by those skilled in the art that computer-readable media can be any available computer media that can be accessed by the night view simulation computer 102. Computer-readable media includes communication media, such as signals, and computer-readable storage media. By way of example, and not limitation, computer-readable storage media includes volatile and non-volatile, removable and non-removable media implemented in any method or technology for the storage of information, such as computer-readable instructions, data structures, program modules, or other data. For example, computer-readable storage media includes, but is not limited to, RAM, ROM, EPROM, EEPROM, flash memory or other solid state memory technology, CD-ROM, digital versatile disks (DVD), HD-DVD, BLU-RAY, or other optical storage, magnetic cassettes, magnetic tape, magnetic disk storage or other magnetic storage devices, or any other medium which can be used to store the desired information in a non-transitory fashion and which can be accessed by the night view simulation computer 102. According to one embodiment, the night view simulation computer 102 may have access to computer-readable storage media storing computer-executable instructions that, when executed by the computer, perform the routine 700 for simulating a night view of a horizon, as described above in regard to FIG. 7.

According to various embodiments, the night view simulation computer 102 may operate in a networked environment using logical connections to remote computers through a network, such as the network 801. The night view simulation computer 102 may connect to the network 801 through a network interface unit 814 connected to the bus 810. It should be appreciated that the network interface unit 814 may also be utilized to connect to other types of networks and remote computer systems. The night view simulation computer 102 may also include an input/output controller 816 for providing output to a display device, such as an ECDIS 104, computer monitor, a printer, or other type of output device. The input/output controller 816 may further receive input from devices, such as a keyboard, mouse, electronic stylus, touch screen, and the like. It will be further appreciated that the night view simulation computer 102 may not include all of the elements shown in FIG. 8, may include other elements that are not explicitly shown in FIG. 8, or may utilize an architecture completely different than that shown in FIG. 8.

Based on the foregoing, it should be appreciated that technologies for providing a night view simulation are disclosed herein. Although the subject matter presented herein has been described in language specific to computer structural features, methodological acts, and computer-readable media, it is to be understood that the disclosure defined in the appended claims is not necessarily limited to the specific features, acts, or media described herein. Rather, the specific features, acts, and mediums are disclosed as example forms of implementing the claims.

The subject matter described above is provided by way of illustration only and should not be construed as limiting. Various modifications and changes may be made to the subject matter described herein without following the example embodiments and applications illustrated and described, and without departing from the true spirit and scope of the present disclosure, which is set forth in the following claims.

What is claimed is:

1. A computer-implemented method for simulating a night view of a horizon, the method comprising:
    determining a plurality of positions of a plurality of light sources from a perspective of a viewer location;
    determining a plurality of light attributes associated with the plurality of light sources;
    displaying a horizon view visualization comprising a plurality of light representations corresponding with the plurality of light sources, the plurality of light representations depicted according to the plurality of positions and the plurality of light attributes; and
    for each of the plurality of light sources, determining whether the position of the light source is within a threshold distance from water positioned between the light source and the viewer location, and if the position of the light source is within the threshold distance, determine that a reflection exists and display a reflection representation on the horizon view visualization corresponding with the light source.

2. The computer-implemented method of claim 1, wherein determining the plurality of positions of the plurality of light sources from the perspective of the viewer location comprises determining a bearing and a distance of each light source from the viewer location, and a height differential above sea level of each light source with respect to the viewer location.

3. The computer-implemented method of claim 2, wherein determining the plurality of light attributes comprises determining a brightness or color of each light source.

4. The computer-implemented method of claim 2, wherein determining the plurality of light attributes comprises determining a blink frequency of each light source.

5. The computer-implemented method of claim 2, further comprising determining a plurality of field of view parameters associated with the horizon view visualization, wherein providing the horizon view visualization comprises providing the horizon view visualization according to the plurality of field of view parameters.

6. The computer-implemented method of claim 5, wherein determining the plurality of field of view parameters comprises determining a field of view direction, a field of view width, and a field of view depth.

7. The computer-implemented method of claim 6, further comprising:
    determining whether a display limitation exists for each of the plurality of light sources according to the plurality of field of view parameters,
    wherein the plurality of light representations are depicted according to the plurality of positions, the plurality of light attributes, and the display limitation.

8. The computer-implemented method of claim 1, wherein the reflection representation comprises characteristics corresponding to the light source, the position of the light source with respect to the position of the viewer location, or the position of the light source with respect to the water.

9. A non-transitory computer-readable storage medium comprising computer-executable instructions that, when executed by a computer, cause the computer to:
    determine a bearing and a distance of each light source from a viewer location, and a height differential above sea level of each light source with respect to the viewer location;
    for each of the plurality of light sources, determine whether a reflection of the light source would be visible on water positioned between the light source and the viewer location based on the determined bearing and distance; and
    display a horizon view visualization comprising
        a plurality of light representations corresponding to the plurality of light sources, and
        a reflection representation corresponding to each light source having a reflection that would be visible on the water positioned between the light source and the viewer location.

10. The non-transitory computer-readable storage medium of claim 9, comprising computer-executable instructions that, when executed by a computer, further cause the computer to determine a plurality of light attributes associated with the plurality of light sources, wherein the plurality of light representations comprise the plurality of light attributes.

11. The non-transitory computer-readable storage medium of claim 10, wherein the plurality of light attributes comprises a blink frequency, a brightness, or a color.

12. The non-transitory computer-readable storage medium of claim 9, comprising computer-executable instructions that, when executed by a computer, further cause the computer to determine a plurality of field of view parameters associated with the horizon view visualization, the plurality of field of view parameters comprising a field of view direction, a field of view width, and a field of view depth, wherein causing the computer to provide the horizon view visualization comprises causing the computer to provide the horizon view visualization according to the plurality of field of view parameters.

13. The non-transitory computer-readable storage medium of claim 9, wherein the reflection representation comprises characteristics corresponding to the light source, the position of the light source with respect to the position of the viewer location, or the position of the light source with respect to the water.

14. A computer-implemented method for simulating a night view of a horizon, the method comprising:
- receiving a selection of a plurality of field of view parameters;
- determining a field of view according to the plurality of field of view parameters;
- determining a plurality of positions of a plurality of light sources from a perspective of a viewer location according to the field of view, the plurality of positions each including a distance from the viewer location;
- determining a plurality of light attributes associated with the plurality of light sources;
- for each of the plurality of light sources, determining whether a reflection of the light source exists on water positioned between the light source and the viewer location;
- for each reflection, determining a reflection characteristic corresponding to the light source, the position of the light source with respect to the position of the viewer location, or the position of the light source with respect to the water, wherein the reflection characteristic comprises a color, a size, a shape, and a position with respect to the light source;
- displaying a horizon view visualization according to the field of view, the horizon view visualization comprising
  - a plurality of light representations corresponding to the plurality of light sources and depicting the plurality of light attributes, and
  - a reflection representation corresponding to each light source having a reflection on the water positioned between the light source and the viewer location, the reflection representation depicting the reflection characteristic.

15. The computer-implemented method of claim 14, wherein the plurality of field of view parameters comprises a field of view direction, a field of view width, and a field of view depth.

16. The computer-implemented method of claim 14, wherein the plurality of light attributes comprises a blink frequency, a brightness, or a color.

17. A computer-implemented method for simulating a night view of a horizon, the method comprising:
- determining a plurality of positions of a plurality of light sources according to a bearing and a distance of each light source from a viewer location, and a height differential above sea level of each light source with respect to the viewer location;
- determining a blink frequency associated with each light source of the plurality of light sources; and
- displaying a horizon view visualization comprising a plurality of light representations corresponding with the plurality of light sources, the plurality of light representations depicted according to the plurality of positions and the blink frequency associated with each light source at the plurality of positions.

18. The computer-implemented method of claim 17, further comprising determining a plurality of field of view parameters associated with the horizon view visualization, wherein providing the horizon view visualization comprises providing the horizon view visualization according to the plurality of field of view parameters.

19. The computer-implemented method of claim 18, wherein determining the plurality of field of view parameters comprises determining a field of view direction, a field of view width, and a field of view depth.

20. The computer-implemented method of claim 19, further comprising:
- determining whether a display limitation exists for each of the plurality of light sources according to the plurality of field of view parameters,
- wherein the plurality of light representations are depicted according to the plurality of positions, the blink frequency associated with each light source at the plurality of positions, and the display limitation.

* * * * *